(12) United States Patent
Mizuta et al.

(10) Patent No.: US 10,093,044 B2
(45) Date of Patent: Oct. 9, 2018

(54) IMPRINTING APPARATUS AND IMPRINTING METHOD

(71) Applicant: Toshiba Memory Corporation, Minato-ku (JP)

(72) Inventors: Yoshio Mizuta, Yokkaichi (JP); Manabu Takakuwa, Tsu (JP); Masato Suzuki, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 258 days.

(21) Appl. No.: 14/946,915

(22) Filed: Nov. 20, 2015

(65) Prior Publication Data
US 2017/0050351 A1  Feb. 23, 2017

(30) Foreign Application Priority Data

Aug. 20, 2015  (JP) ................ 2015-162887

(51) Int. Cl.
*B29C 59/02* (2006.01)
*B29C 43/58* (2006.01)
*G03F 7/00* (2006.01)

(52) U.S. Cl.
CPC ............ *B29C 43/58* (2013.01); *G03F 7/0002* (2013.01); *B29C 2043/5825* (2013.01)

(58) Field of Classification Search
CPC ............ B29C 43/58; B29C 2043/5825; G03F 7/0002
See application file for complete search history.

(56) References Cited

U.S. PATENT DOCUMENTS

| | | | |
|---|---|---|---|
| 7,703,066 B2 * | 4/2010 | Itoh .......................... | G03F 1/70 430/5 |
| 8,193,100 B2 | 6/2012 | Itoh | |
| 8,533,634 B2 | 9/2013 | Itoh | |
| 2011/0143271 A1 | 6/2011 | Koshiba et al. | |
| 2012/0061875 A1 * | 3/2012 | Kono ..................... | B29C 59/022 264/293 |
| 2013/0207288 A1 | 8/2013 | Mikami | |

FOREIGN PATENT DOCUMENTS

| | | |
|---|---|---|
| JP | 4488822 | 6/2010 |
| JP | 5395769 | 1/2014 |
| JP | 5398502 | 1/2014 |
| JP | 5687640 | 3/2015 |

* cited by examiner

*Primary Examiner* — Galen H Hauth
(74) *Attorney, Agent, or Firm* — Oblon, McClelland, Maier & Neustadt, L.L.P.

(57) ABSTRACT

In an imprinting apparatus according to one embodiment, rear surfaces of first and second templates are suctioned. A correction information calculating device calculates a second response coefficient of the second template out of first response coefficients based on a flatness relational expression and flatness of the second template. The first response coefficients are actual amounts of positional slippage of the first template from a first input adjustment value. The flatness relational expression indicates a relationship between flatness of the first template and the first response coefficients. A shape and a size of the second template are adjusted using the second response coefficient.

4 Claims, 13 Drawing Sheets

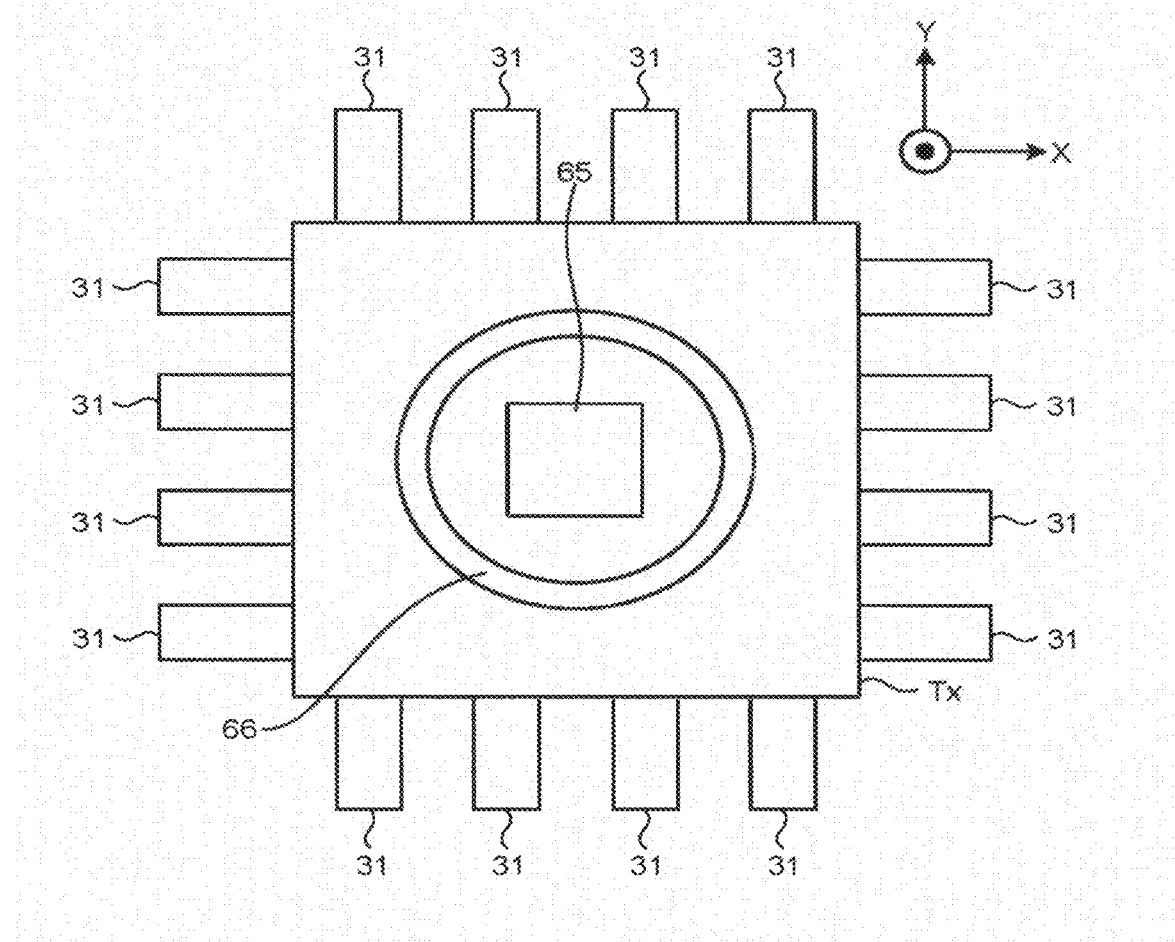

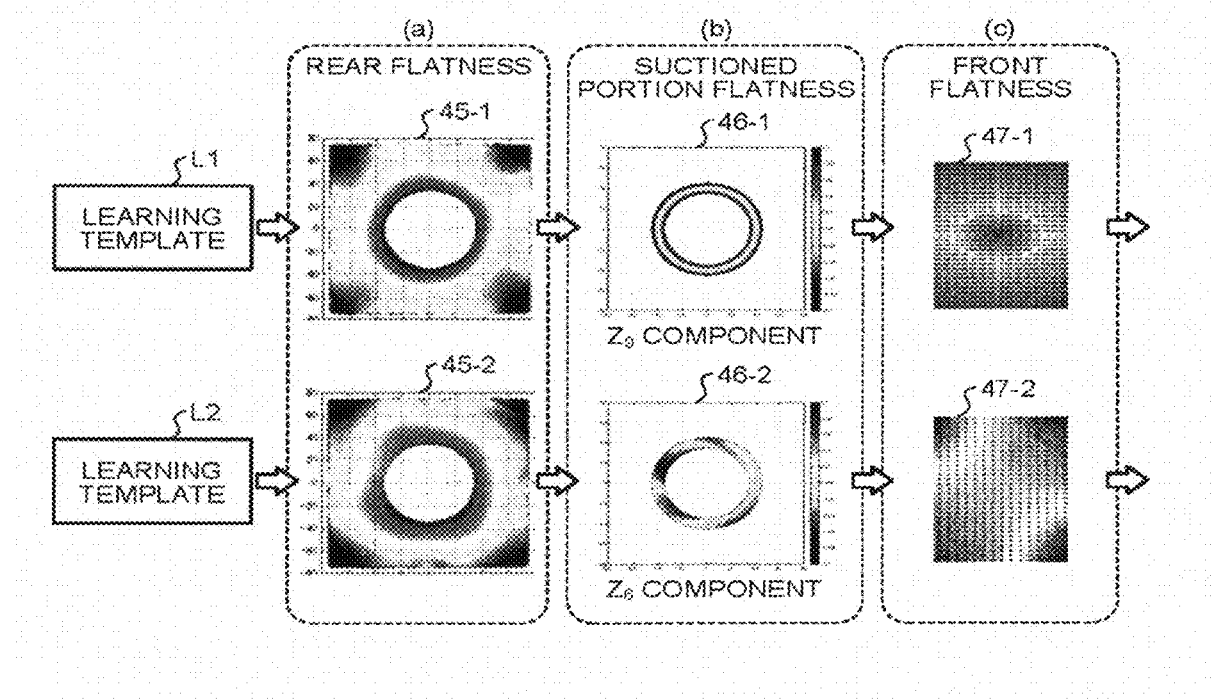

IMPRINTING APPARATUS AND IMPRINTING METHOD

CROSS-REFERENCE TO RELATED APPLICATIONS

This application is based upon and claims the benefit of priority from Japanese Patent Application No. 2015-162887, filed on Aug. 20, 2015; the entire contents of which are incorporated herein by reference.

FIELD

Embodiments described herein relate generally to an imprinting apparatus and an imprinting method.

BACKGROUND

Imprinting lithography which is a lithography method of a semiconductor process is a technique of transferring a pattern to a transfer substrate using a template of the same magnification. In the imprinting lithography, in order to prevent positional slippage between layers, a stress is applied to the side surface of the template in pressing the template against a resist on the transfer substrate. Accordingly, the size of a template pattern is adjusted in magnification and then the template pattern is transferred to the resist.

Slippage occurs between an input magnification value (magnification adjustment value) for applying a stress on the side surface of the template and a magnification of a shot pattern which is actually formed. Accordingly, in the related art, a magnification response coefficient is calculated from a relational expression of the input magnification value and the magnification of the actual shot pattern. The input magnification value is corrected based on the magnification response coefficient and then a stress is applied to the side surface of the template.

However, the magnification response coefficient varies depending on templates and thus the magnification response coefficient is calculated for each template. Accordingly, a long time is required for setting conditions in imprinting.

BRIEF DESCRIPTION OF THE DRAWINGS

FIG. 3 is a top view illustrating a configuration of a pressing unit according to the embodiment;

FIG. 11 is a diagram illustrating calculation examples of front flatness according to the embodiment;

DETAILED DESCRIPTION

According to an embodiment, there is provided an imprinting apparatus. The imprinting apparatus includes an adjustment unit, a suction unit, a contact processing unit, a correction information calculating device, and a control unit. The adjustment unit adjusts a shape and a size of a first template by an amount corresponding to a first input adjustment value in performing a first imprinting process using the first template. The adjustment unit adjusts a shape and a size of a second template by an amount corresponding to a second input adjustment value in performing a second imprinting process using the second template. The suction unit suctions and fixes a rear surface of the first template in performing the first imprinting process. The suction unit suctions and fixes a rear surface of the second template in performing the second imprinting process. The contact processing unit brings a template pattern formed on a front surface of the second template into contact with a resist placed on a substrate and fills the template pattern with the resist. The correction information calculating device calculates a second response coefficient corresponding to the second template as correction information out of first response coefficients based on a flatness relational expression and flatness of the second template suctioned by the suction unit. The first response coefficients are actual amounts of positional slippage of the first template from the first input adjustment value. The flatness relational expression indicates a relation between the flatness of the first template suctioned by the suction unit and the first response coefficients. The control unit corrects the second input adjustment value using the correction information. The control unit causes the adjustment unit to adjust the shape and the size of the second template with the corrected second input adjustment value.

Exemplary embodiments of an imprinting apparatus and an imprinting method will be described below in detail with reference to the accompanying drawings. The present invention is not limited to the following embodiments.

Embodiments

Figure 1:
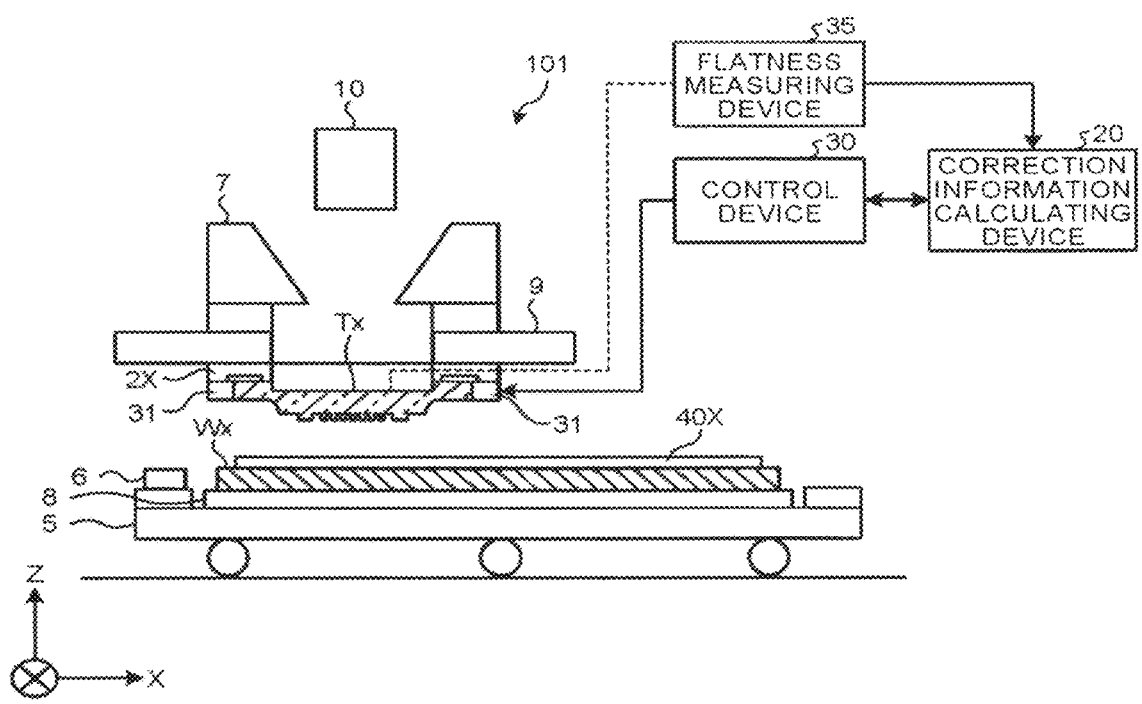
FIG. 1 is a diagram illustrating a configuration of an imprinting apparatus according to an embodiment.

FIG. 1 is a diagram illustrating a configuration of an imprinting apparatus according to an embodiment. FIG. 1 illustrates a configuration of an imprinting apparatus 101 when viewed from the Y axis direction. In this embodiment, a plane on which a wafer Wx is mounted is an XY plane and the top surface of the wafer Wx is perpendicular to the Z axis.

The imprinting apparatus 101 is an apparatus that performs an imprinting process such as nano-imprinting lithography (NIL). The imprinting apparatus 101 transfers a
} template pattern of a template Tx as a mold substrate to a transfer substrate (semiconductor substrate) such as a wafer Wx. The template is a master mold formed of a plate-shaped member having a rectangular main surface and the template pattern is an embossed pattern such as a circuit pattern. The template pattern is formed on a mesa on the top of the template Tx.

The imprinting apparatus 101 forms a resist pattern on the entire surface of the wafer Wx in a step & repeat manner. The imprinting apparatus 101 adjusts the magnification of the size of the template pattern for each template.

The imprinting apparatus 101 according to this embodiment calculates a relational expression of flatness affecting the front surface of the template and a magnification response coefficient (hereinafter, referred to as a front relational expression) in advance using a learning template L (not illustrated).

The magnification response coefficient indicates a relationship between an input magnification value (magnification adjustment value) for applying a stress to a side surface of the template and the magnification of a shot pattern which is actually formed. In other words, the magnification response coefficient is correction information Indicating at what short magnification a pattern is actually formed on the wafer Wx with respect to the input magnification value.

The imprinting apparatus 101 calculates the magnification response coefficient corresponding to the flatness of the template Tx based on the flatness of the template Tx and the front relational expression in performing an imprinting process. The imprinting apparatus 101 calculates a magnification correction value using the magnification response coefficient. The magnification correction value is a correction value that is used to correct the size or the shape of a shot (template pattern area) of the template Tx.

Slippage occurs between the input magnification value (magnification adjustment value) for applying a stress to the side surface of the template and the magnification of the shot pattern which is actually formed. The magnification correction value is used to correct the slippage. Accordingly, when the input magnification value is equal to the magnification of the shot pattern which is actually formed, the magnification correction value is 0.

A learning template L is used to calculate the front relational expression. In this embodiment, plural learning templates L are prepared. The learning templates L have a variety of rear flatness which differs depending on the learning templates L. The imprinting apparatus 101 creates the front relational expression for each flatness of a template pattern surface using the plural learning templates L. The imprinting apparatus 101 creates the front relational expression corresponding to first flatness, for example, using the first learning template L and creates the front relational expression corresponding to M-th flatness using the M-th (where M is a natural number) learning template L.

The templates Tx to be used when the imprinting apparatus 101 uses for the imprinting process, are various templates T1 to TN (where N is a natural number) for the imprinting process. The imprinting apparatus 101 calculates the magnification correction value using the front relational expressions corresponding to the templates Tx.

The imprinting apparatus 101 includes a master stage 2X, a sample stage 5, a reference mark 6, an alignment sensor 1, a substrate chuck 8, a stage base 9, a light source 10, and a pressing unit 31. The imprinting apparatus 101 according to this embodiment further includes a correction information calculating device 20, a control device 30, and a flatness measuring device 35.

The sample stage 5 has a wafer Wx mounted thereon and moves in a plane (horizontal plane) parallel to the mounted wafer Wx. The sample stage 5 introduces the wafer Wx in which a resist 40X as a transfer material is applied substantially to the entire surface (entire surface other than edges) thereof and moves below the template Tx. The sample stage 5 sequentially moves shot positions on the wafer Wx below the template Tx in performing an imprinting process to the wafer Wx.

The substrate chuck 8 is disposed on the sample stage 5. The substrate chuck 8 fixes the wafer Wx to a certain position on the sample stage 5. The reference mark 6 is disposed on the sample stage 5. The reference mark 6 is a mark used to detect the position of the sample stage 5 and is used to position the wafer Wx in loading the wafer onto the sample stage 5.

The master stage 2X is disposed on the bottom surface side (the wafer Wx side) of the stage base 9. The master stage 2X fixes the template Tx to a certain position from the rear surface side (surface on which the template pattern is not formed) of the template Tx by vacuum suction or the like.

The pressing unit 31 is disposed on the bottom surface side of the master stage 2X. The pressing unit 31 is constituted by an actuator or the like and applies a stress to the side surface of the template Tx. The pressing unit 31 has a function of a manipulator. The pressing unit 31 adjusts the shape or the size of the template Tx by pressing the template Tx from the side surface side of the template Tx in four directions. Accordingly, the mesa of the template Tx is deformed. As a result, the positional slippage or the like of the template pattern formed on the template Tx is corrected.

The stage base 9 supports the template Tx using the master stage 2X and presses the template pattern of the template Tx onto the resist 40X on the wafer Wx. The stage base 9 performs pressing of the template Tx onto the resist 40X and separating (releasing) of the template Tx from the resist 40X by moving vertically (in the vertical direction).

The resist 40X used for imprinting is a resin (phot-curable agent) having characteristics such as photo-curability. The alignment sensor 7 is disposed on the stage base 9. The alignment sensor 7 is a sensor for detecting the position of the wafer Wx or the position of the template Tx.

The light source 10 is a light source emitting light such as UV rays and is disposed above the stage base 9. The light source 10 applies UV rays from above the transparent template Tx in a state in which the template Tx is pressed onto the resist 40X.

The control device 30 is connected to the elements of the imprinting apparatus 101 and controls the elements. In FIG. 1, the control device 30 is connected to the pressing unit 31, but connection to the other elements is not illustrated. The control device 30 controls the pressing unit 31 by transmitting an input magnification value (magnification adjustment value) to the pressing unit 31. The pressing unit 31 presses the side surface of the template Tx with a force of a magnitude corresponding to the input magnification value.

The control device 30 transmits the input magnification value to the pressing unit 31 without correcting the input magnification value when the master stage 2X suctions the learning template L. The control device 30 also transmits the non-corrected input magnification value to the flatness measuring device 35.

The control device 30 calculates the magnification correction value using the magnification response coefficient transmitted from the correction information calculating device 20 when the master stage 2X suctions the template Tx. The control device 30 corrects the input magnification value using the magnification correction value. The control device 30 transmits the corrected input magnification value to the pressing unit 31 when the master stage 2X suctions the template Tx.

The flatness measuring device 35 measures the rear flatness of the template Tx or the learning template L. The flatness measuring device 35 measures the rear flatness in a state in which the master stage 2X suctions the template Tx or the learning template L. The flatness measuring device 35 transmits the measured rear flatness to the correction information calculating device 20.

The correction information calculating device 20 creates a front relational expression for each template pattern surface using the rear flatness of the learning template L. The correction information calculating device 20 calculates the magnification correction value based on the front relational expression and the rear flatness of the template Tx. The correction information calculating device 20 transmits the calculated magnification correction value to the control device 30.

Hereinafter, it is assumed that a wafer Wy (not illustrated) is used to perform an imprinting process using the learning template L and a wafer Wx is used to perform an imprinting process using the template Tx.

When an imprinting process is performed on the wafer Wx, the wafer Wx onto which the resist 40X is applied or dropped moves immediately below the template Tx. The template Tx is pressed onto the resist 40X on the wafer Wx.

When an imprinting process is performed on the wafer Wy, the wafer Wy onto which the resist 40X is applied or dropped moves immediately below the learning template L. The learning template L is pressed onto the resist 40X on the wafer Wy.

The imprinting apparatus 101 may press the resist 40X or the learning template L onto the template Tx instead of pressing the template Tx or the learning template L onto the resist 40X. In this case, the sample stage 5 presses the resist 40X on the wafer Wx or the learning template L onto the template Tx or the learning template L. In this way, when the template pattern is pressed onto the resist 40X, the imprinting apparatus 101 decreases a distance between the template Tx or the learning template L and the wafer Wx or Wy on which the resist 40X is disposed so as to be a certain distance. Accordingly, the template pattern comes in contact with the resist 40X.

The process flow of the imprinting process will be described below. FIGS. 2A to 2D are diagrams illustrating the process flow of the imprinting process. FIGS. 2A to 2D illustrate cross-sectional views of the wafer Wx or the template Tx in the imprinting process.

Figure 2A:
FIGS. 2A to 2D are diagrams illustrating a process flow of an imprinting process.

As illustrated in FIG. 2A, the resist 40X is dropped onto the top surface of the wafer Wx by an ink jet method. The resist 40X is an imprinting material such as a photo-curable resin material. A low-k (low-dielectric) film, an organic material, or the like is used as the resist 40X.

Figure 2B:
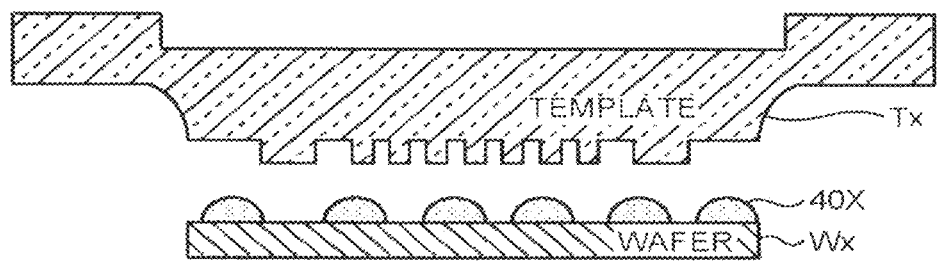
Figure 2C:

After the resist 40X is dropped, the template Tx moves to the resist 40X as illustrated in FIG. 2B, and the template Tx is pressed onto the resist 40X as Illustrated in FIG. 2C. When the template Tx formed by engraving a quartz plate or the like comes in contact with the resist 40X, the resist 40X flows into the template pattern of the template Tx by a capillary phenomenon. The template pattern is an embossed pattern which is formed by plasma etching or the like.

The template Tx and the resist 40X come in contact with each other for a certain time. Accordingly, the template pattern is filled with the resist 40X. When UV rays from the light source 10 is applied to the resist 40X via the template Tx in this state, the resist 40X is cured.

Figure 2D:

Thereafter, by releasing the template Tx from the cured resist (resist pattern) 40Y as illustrated in FIG. 2D, the resist pattern 40Y which is obtained by inverting the template pattern is formed on the wafer Wx. The imprinting apparatus 101 performs the imprinting process onto a second shot on the wafer Wx after performing the imprinting process onto a first shot on the wafer Wx.

Although the imprinting process of the template Tx onto the wafer Wx is described herein, the same is true of the imprinting process of the learning template L onto the wafer Wy.

The configuration of the pressing unit 31 according to the embodiment will be described below. FIG. 3 is a top view illustrating the configuration of the pressing unit according to the embodiment. FIG. 3 is a top view of the pressing unit 31 and the template Tx when viewed from the Z axis direction.

The template Tx has a pattern area 65 in which the template pattern is formed at the center thereof. The pattern area 65 is, for example, a rectangular area. The pattern area 65 is a front area of the template Tx. The template Tx is fixed to the master stage 2X from the rear surface side. The area outside the pattern area 65 in the template Tx is suctioned by the master stage 2X. The suction area 66 in which template Tx is suctioned by the master stage 2X is, for example, a ring-shaped area.

The pressing unit 31 is disposed on the side surface side of the template Tx so as to press the side surface of the template Tx. The pressing unit 31 presses the side surface facing the −X direction, the side surface facing the +X direction, the side surface facing the +Y direction, and the side surface facing the −Y direction out of the side surfaces of the template Tx. The number of pressing units 31 pressing each side surface of the template Tx may be one or more. The pressing unit 31 performs the same pressing as the template Tx on the learning template L.

Figure 4:
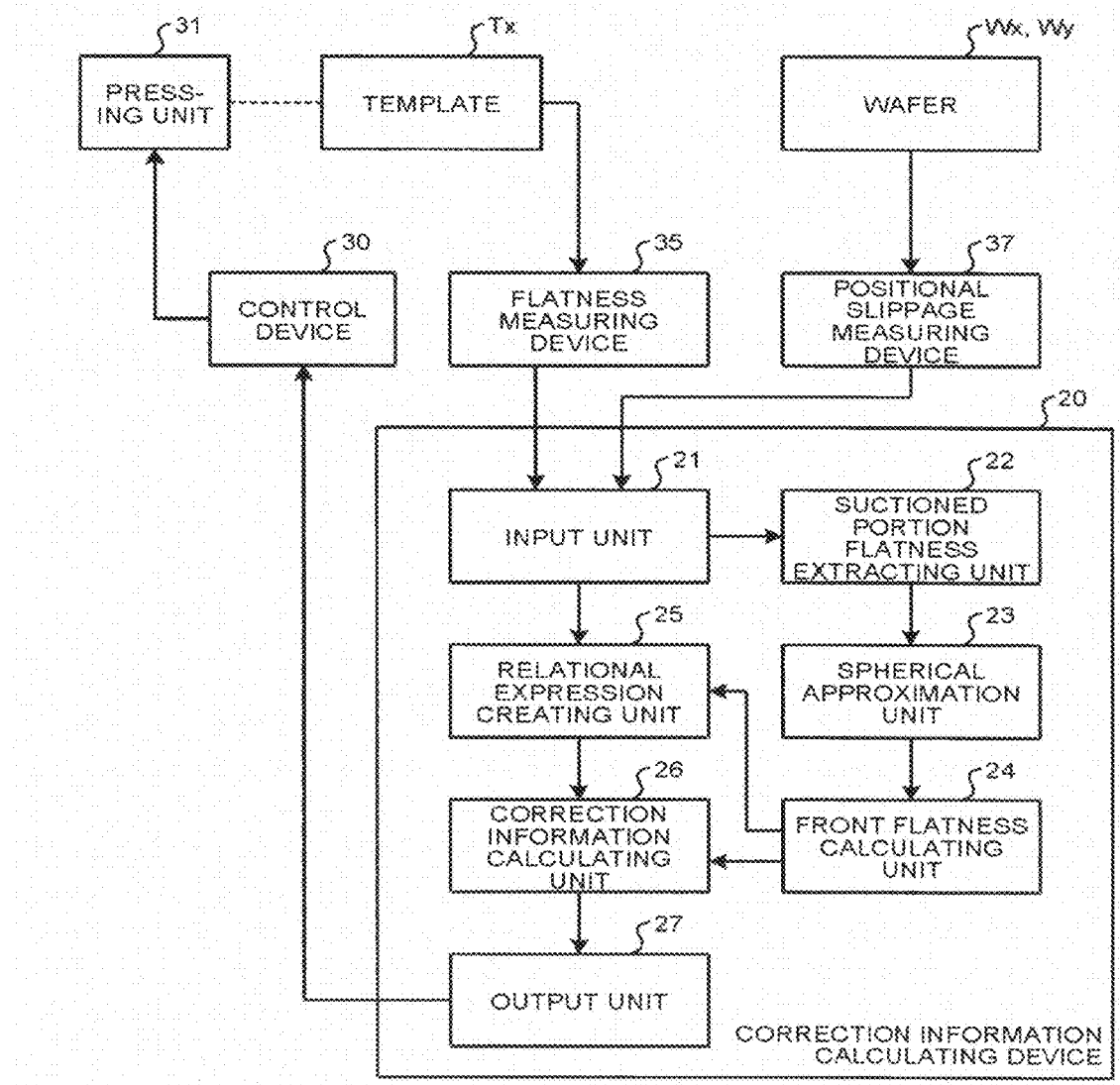
FIG. 4 is a diagram illustrating a configuration of a magnification correction value calculating device according to the embodiment.

FIG. 4 is a diagram illustrating the configuration of the magnification correction value calculating device according to the embodiment. In FIG. 4, the pressing unit 31 applies a pressure to the template Tx, but the pressing unit 31 applies a pressure to the template Tx or the learning template L.

The correction information calculating device 20 includes an input unit 21, a suctioned portion flatness extracting unit 22, a spherical approximation unit 23, a front flatness calculating unit 24, a relational expression creating unit 25, a correction information calculating unit 26, and an output unit 27.

In the imprinting apparatus 101, the pressing unit 31 presses the side surface of the template Tx or the learning template L. The control device 30 is connected to the pressing unit 31 and the positional slippage measuring device 37. In FIG. 4, the connection between the control device 30 and the positional slippage measuring device 37 is not illustrated. The control device 30 transmits the input magnification value to the pressing unit 31 and the positional slippage measuring device 37.

The flatness measuring device 35 measures the rear flatness of the template Tx or the learning template L and transmits the measurement result to the correction information calculating device 20. The positional slippage measuring device 37 is connected to the correction information calculating device 20. The positional slippage measuring device 37 is a device that measures an amount of positional slippage of the resist pattern formed on the wafer Wy. The positional slippage measuring device 37 transmits correlation information in which an amount of positional slippage as the measurement result and the input magnification value from the control device 30 are correlated with each other to the correction Information calculating device 20.

The input unit 21 receives an input of the rear flatness (measurement result) from the flatness measuring device 35 and transmits the input rear flatness to the suctioned portion flatness extracting unit 22. The input unit 21 receives an input of the correlation information from the positional slippage measuring device 37 and transmits the input correlation information to the relational expression creating unit 25.

The suctioned portion flatness extracting unit 22 extracts the flatness of the rear suctioned portion (hereinafter, referred to as suctioned portion flatness) out of the rear flatness. Specifically, the suctioned portion flatness extracting unit 22 extracts the flatness (suctioned portion flatness) of the area of the template Tx and the learning template L of which the rear surface is suctioned out of the rear flatness of the template Tx and the learning template L. The suctioned portion flatness extracting unit 22 transmits the suctioned portion flatness to the spherical approximation unit 23.

The spherical approximation unit 23 calculates a coefficient when the suctioned portion flatness is functionally approximated in the polar coordinate system. Specifically, the spherical approximation unit 23 calculates a Zernike coefficient by approximating the suctioned portion flatness to a Zernike series. The spherical approximation unit 23 transmits the Zernike coefficient to the front flatness calculating unit 24.

The front flatness calculating unit 24 calculates the flatness (hereinafter, referred to as front flatness) that affects the front surface (template pattern surface) of the template Tx or the learning template L based on the Zernike coefficient.

When the front flatness of the learning template L is calculated, the front flatness calculating unit 24 transmits the calculated front flatness to the relational expression creating unit 25. When the front flatness of the template Tx is calculated, the front flatness calculating unit 24 transmits the calculated front flatness to the correction information calculating unit 26.

The imprinting apparatus 101 performs the imprinting process using various input magnification values on the learning templates L in accordance with an instruction from the control device 30. For example, the imprinting apparatus 101 performs the imprinting process on a first learning template using first to P-th (where P is a natural number of two or greater) input magnification values. The imprinting apparatus 101 performs the imprinting process on a Q-th (where Q is a natural number of two or greater) learning template using the first to P-th input magnification values.

A resist pattern is formed on the wafer Wx using the template Tx. A resist pattern is formed on the wafer Wy using the learning template L.

The amounts of positional slippage of the resist patterns on the wafers Wx and Wy formed by the Imprinting process are measured by the positional slippage measuring device 37. The correlation information in which the amounts of positional slippage and the input magnification values are correlated is transmitted to the relational expression creating unit 25 via the input unit 21.

The relational expression creating unit 25 calculates the magnification response coefficient (shot magnification response coefficient) based on the correlation information. Specifically, the relational expression creating unit 25 calculates the magnification response coefficient for each learning template L based on the correlation between the measured amounts of positional slippage and the input magnification values.

Each learning template L has specific front flatness. When the imprinting process is performed using the learning template L, the input magnification value corresponding to the front flatness of the learning template L is input and the imprinting process is performed. Accordingly, the input magnification value or the amount of positional slippage varies depending on the learning templates L. As a result, the front flatness and the magnification response coefficient vary depending on the learning templates L.

In this embodiment, the imprinting process is performed using various learning templates L. The relational expression creating unit 25 creates the relational expression (front relational expression) between the front flatness and the magnification response coefficient. The front relational expression is stored in the relational expression creating unit 25.

The correction information calculating unit 26 calculates correction information (the magnification response coefficient of the template Tx) for correcting an amount of magnification adjustment of the template Tx based on the front flatness of the template Tx transmitted from the front flatness calculating unit 24 and the front relational expression transmitted from the relational expression creating unit 25. The correction information calculating unit 26 transmits the calculated magnification response coefficient to the output unit 27. The output unit 27 transmits the magnification response coefficient to the control device 30.

The control device 30 calculates the input magnification value based on the amount of positional slippage of an underlayer pattern. The underlayer pattern is a pattern which is positioned in performing the imprinting process using the template Tx. The underlayer pattern is disposed under the resist 40X. In performing the imprinting process using the template Tx, the magnification of the template pattern is adjusted by an amount corresponding to the amount of positional slippage of the underlayer pattern. The magnification adjustment at this time is performed based on the input magnification value.

In this way, in this embodiment, the front relational expression (the relational expression between the front flatness and the magnification response coefficient) using the learning template L. The front flatness of the template Tx is calculated. A magnification correction coefficient is extracted from the front relational expression based on the front flatness of the template Tx. The input magnification value to the template Tx is corrected using the magnification correction coefficient.

In this embodiment, the control device 30 calculates the magnification correction value for correcting the input magnification value using the magnification response coefficient. The control device 30 corrects the input magnification value using the magnification correction value in performing the imprinting process using the template Tx. The control device 30 transmits the corrected input magnification value to the pressing unit 31.

Figure 5:
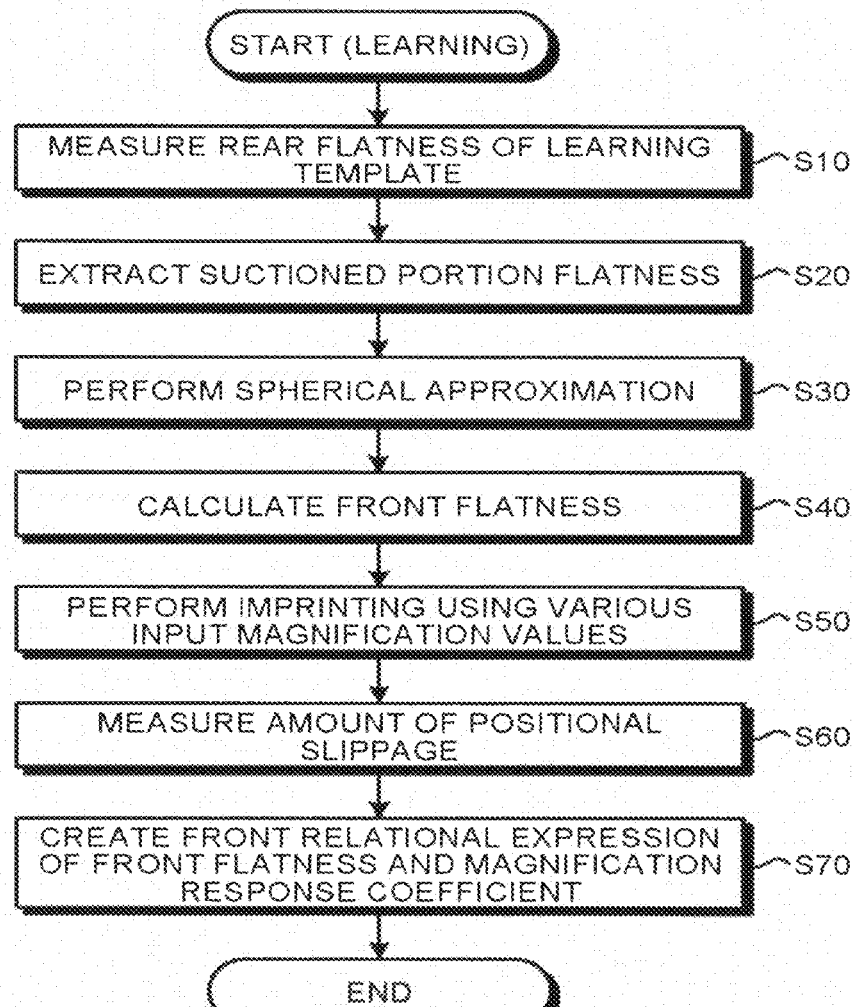
FIG. 5 is a flowchart illustrating a process flow of a magnification response coefficient calculating process according to the embodiment.

The process flow of the magnification response coefficient calculating process and the process flow of the magnification correction value calculating process will be described below. FIG. 5 is a flowchart illustrating the process flow of the magnification response coefficient calculating process according to the embodiment. The magnification response coefficient is calculated using the rear flatness of the learning template L.

The flatness measuring device 35 measures the rear flatness of the learning templates L (step S10). The flatness measuring device 35 measures the rear flatness in a state in which the master stage 2X suctions the learning templates L. The flatness measuring device 35 transmits the measured rear flatness to the correction information calculating device 20.

The rear flatness is transmitted to the suctioned portion flatness extracting unit 22 via the input unit 21. The suctioned portion flatness extracting unit 22 extracts the suctioned portion flatness which is the flatness of the rear suctioned portion out of the rear flatness (step S20). The suctioned portion flatness extracting unit 22 extracts the suctioned portion flatness for each learning template L.

The spherical approximation unit 23 calculates the Zernike coefficient by approximating the suctioned portion flatness to the Zernike series. Accordingly, the spherical approximation unit 23 approximates the suctioned portion flatness for each learning template L (step S30).

The front flatness calculating unit 24 calculates the front flatness which affects the template pattern surface of the template Tx based on the Zernike coefficient (step S40). The front flatness calculating unit 24 calculates the front flatness for each learning template L.

The imprinting apparatus 101 performs the imprinting process on the wafer Wy using various input magnification values for each learning template L (step S50). Accordingly, a resist pattern for each input magnification value is formed on the wafer Wy by rear flatness.

The positional slippage measuring device 37 measures the amount of positional slippage of each resist pattern formed on the wafer Wy (step S60). The positional slippage measuring device 37 creates the correlation information in which the amounts of positional slippage and the input magnification values from the control device 30 are correlated with each other. The positional slippage measuring device 37 creates the correlation information by the rear flatness (for each learning template L).

The correlation information is transmitted to the relational expression creating unit 25 via the input unit 21. The relational expression creating unit 25 calculates the magnification response coefficient by the correlation information based on the correlation information. Accordingly, the relational expression creating unit 25 calculates the magnification response coefficient by the rear flatness. The relational expression creating unit 25 creates the relational expression which is a relational expression between the front flatness of the learning template L and the magnification response coefficient (step S70). The relational expression creating unit 25 creates the front relational expression by the rear flatness. The relational expression creating unit 25 stores the front relational expression.

Figure 6:
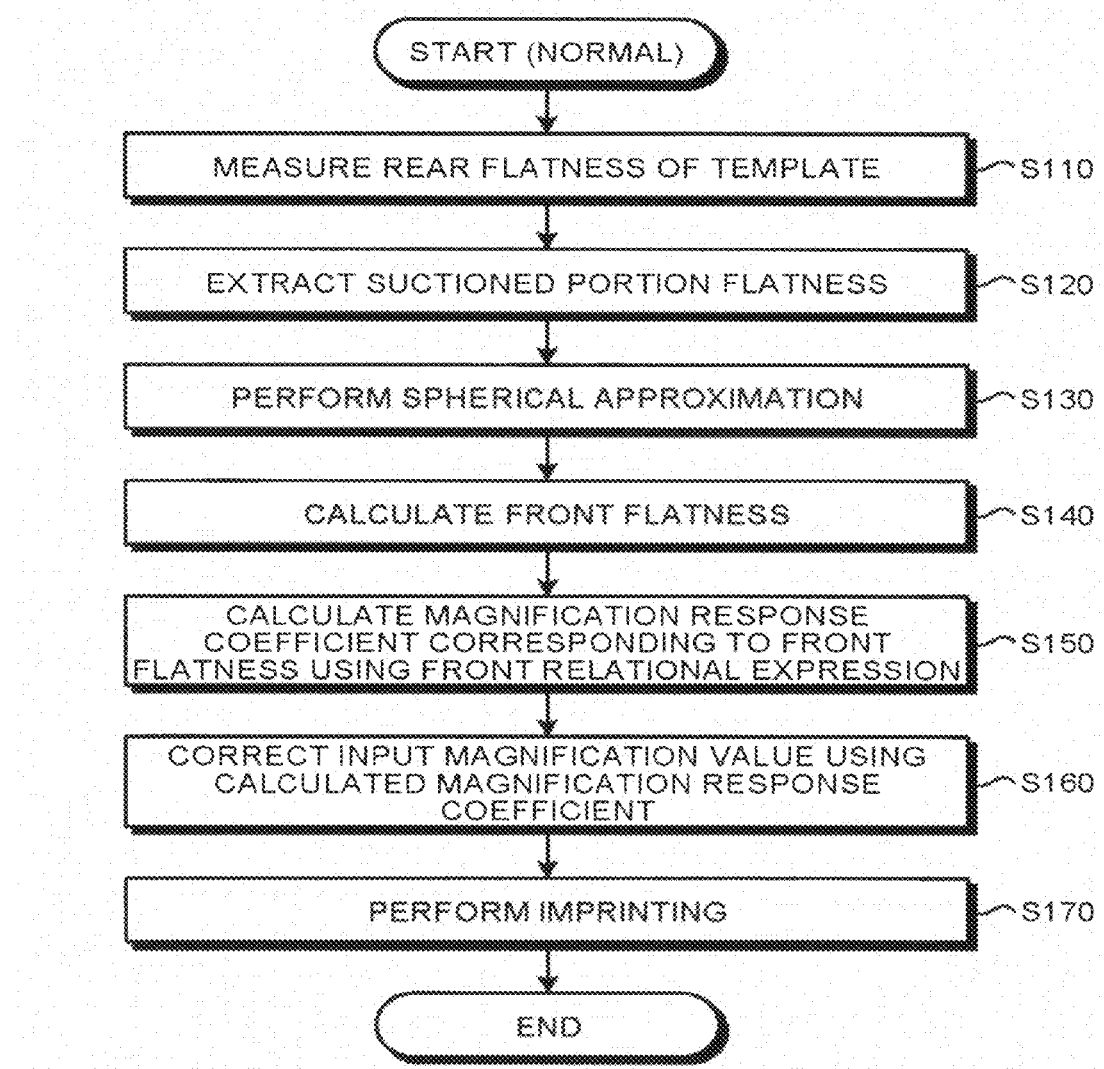
FIG. 6 is a flowchart illustrating a process flow of a magnification correction value calculating process using a magnification response coefficient according to the embodiment.

FIG. 6 is a flowchart illustrating the process flow of the magnification correction value calculating process using the magnification response coefficient according to this embodiment. When an imprinting process is performed on a wafer Wx for a product, the template Tx is introduced into the imprinting apparatus 101.

The flatness measuring device 35 measures the rear flatness of the templates Tx (step S110). The flatness measuring device 35 measures the rear flatness in a state in which the master stage 2X suctions the templates Tx. The flatness measuring device 35 transmits the measured rear flatness to the correction information calculating device 20.

The rear flatness is transmitted to the suctioned portion flatness extracting unit 22 via the input unit 21. The suctioned portion flatness extracting unit 22 extracts the suctioned portion flatness which is the flatness of the rear suctioned portion out of the rear flatness (step S120).

The spherical approximation unit 23 calculates the Zernike coefficient by approximating the suctioned portion flatness to the Zernike series. Accordingly, the spherical approximation unit 23 approximates the suctioned portion flatness for each templates Tx (step S130).

The front flatness calculating unit 24 calculates the front flatness which affects the template pattern surface of the template Tx based on the Zernike coefficient (step S140).

The correction information calculating unit 26 calculates the magnification response coefficient (correction information) of the template Tx based on the front flatness of the template Tx and the front relational expression. Specifically, the correction information calculating unit 26 calculates the magnification correction coefficient corresponding to the front flatness of the template Tx using the front relational expression (step S150). The output unit 27 transmits the magnification response coefficient to the control device 30.

The control device 30 calculates the input magnification value based on the amount of positional slippage of the underlayer pattern. In this way, the imprinting apparatus 101 according to this embodiment calculates the magnification correction value without setting the conditions of the magnification response coefficient of the template Tx.

The control device 30 corrects the magnification correction value for correcting the input magnification value using the calculated magnification response coefficient (step S160). In this way, the control device 30 corrects the input magnification value using the calculated magnification response coefficient. In other words, the control device 30 calculates the magnification correction value in consideration of the magnification response coefficient based on the front relational expression. The imprinting process is performed using the corrected input magnification value (step S170).

In this way, the imprinting apparatus 101 predicts the magnification response coefficient of the template Tx from the rear flatness of the template Tx. The imprinting apparatus 101 corrects the shot magnification using the predicted magnification response coefficient and performs the imprinting process. Since the shot magnification is corrected by the imprinting apparatus 101, it is possible to accurately superpose the resist pattern formed by the resist 40X on the underlayer pattern.

Figure 7:
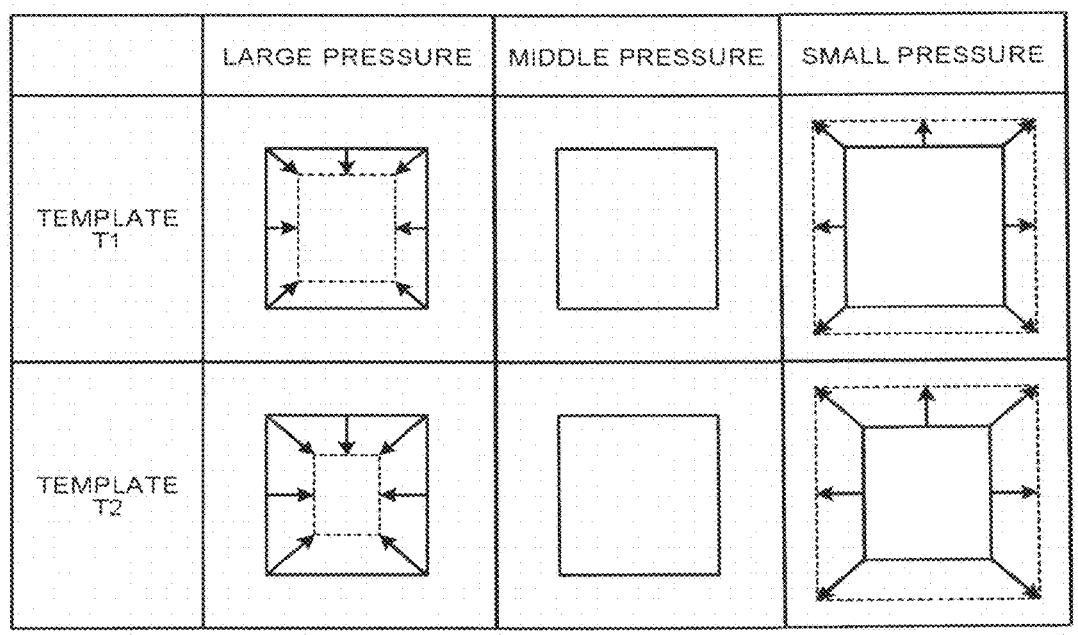
FIG. 7 is a diagram illustrating a relationship between a pressure on a template and a shot magnification of the template.

The reason for correcting the input magnification value for each template Tx will be described below. FIG. 7 is a diagram illustrating a relationship between the pressure on the template and the shot magnification of the template. The template sizes when the magnifications of templates T1 and T2 are changed in three conditions so as to deform the mesa thereof will be described below. Degrees of deformation of the templates T1 and T2 are measured by the positional slippage measuring device 37 or the like.

The template T1 which is an example of the template Tx has a small amount of magnification adjusted with respect to the pressure by the pressing unit 31. In other words, the template T1 has a small degree of reaction to the input magnification value.

On the other hand, the template T2 which is an example of the template Tx has a large amount of magnification adjusted with respect to the pressure by the pressing unit 31. In other words, the template T2 has a large degree of reaction to the input magnification value.

In this case, when the pressing unit 31 applies a large pressure to the side surface of the template T1, the magnification of the template T1 becomes slightly less than a desired size. When the pressing unit 31 applies to an appropriate force (middle pressure) to the side surface of the template T1, the magnification of the template T1 is corrected to an appropriate size. When the pressing unit 31 applies a small pressure to the side surface of the template T1, the magnification of the template T1 becomes slightly greater than a desired side. In this way, the template T1 has a small degree of variation in magnification.

On the other hand, when the pressing unit 31 applies a large pressure to the side surface of the template T2, the magnification of the template T2 becomes much less than a desired size. When the pressing unit 31 applies to an appropriate force (middle pressure) to the side surface of the template T2, the magnification of the template T2 is corrected to an appropriate size. When the pressing unit 31 applies a small pressure to the side surface of the template T2, the magnification of the template T2 becomes much greater than a desired side. In this way, the template T2 has a large degree of variation in magnification.

In this way, since the templates T1 and T2 have different degrees of variation in magnification, the magnification response coefficients thereof are different from each other. Therefore, each of the templates Tx requires correction of the magnification corresponding to the template Tx. Accordingly, the templates Tx require correction of the input magnification value for each template Tx. The middle pressure for making the template T1 in an appropriate size and the middle pressure for making the template T2 in an appropriate size are not necessarily equal to each other.

Figure 8:
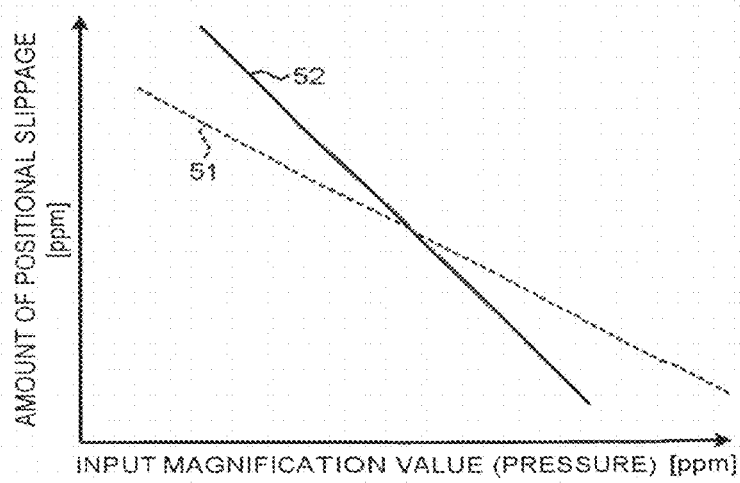
FIG. 8 is a diagram illustrating a magnification response coefficient.

FIG. 8 is a diagram illustrating the magnification response coefficient. Correlation information 51 and 52 illustrated in FIG. 8 are derived based on the relationship between the input magnification value (magnification adjustment value) for applying a stress to the side surfaces of the templates T1 and T2 and the magnification of the actually-formed shot pattern. The correlation information 51 is correlation information of the template T1, and the correlation information 52 is correlation information of the template T2.

The slope of the correlation information 51 is the magnification response coefficient of the template T1 and the slope of the correlation information 52 is the magnification response coefficient of the template T2. As illustrated in FIG. 8, the template T1 has a small degree of variation in magnification and a small magnification response coefficient. The template T2 has a large degree of variation in magnification and a large magnification response coefficient.

Figure 9:
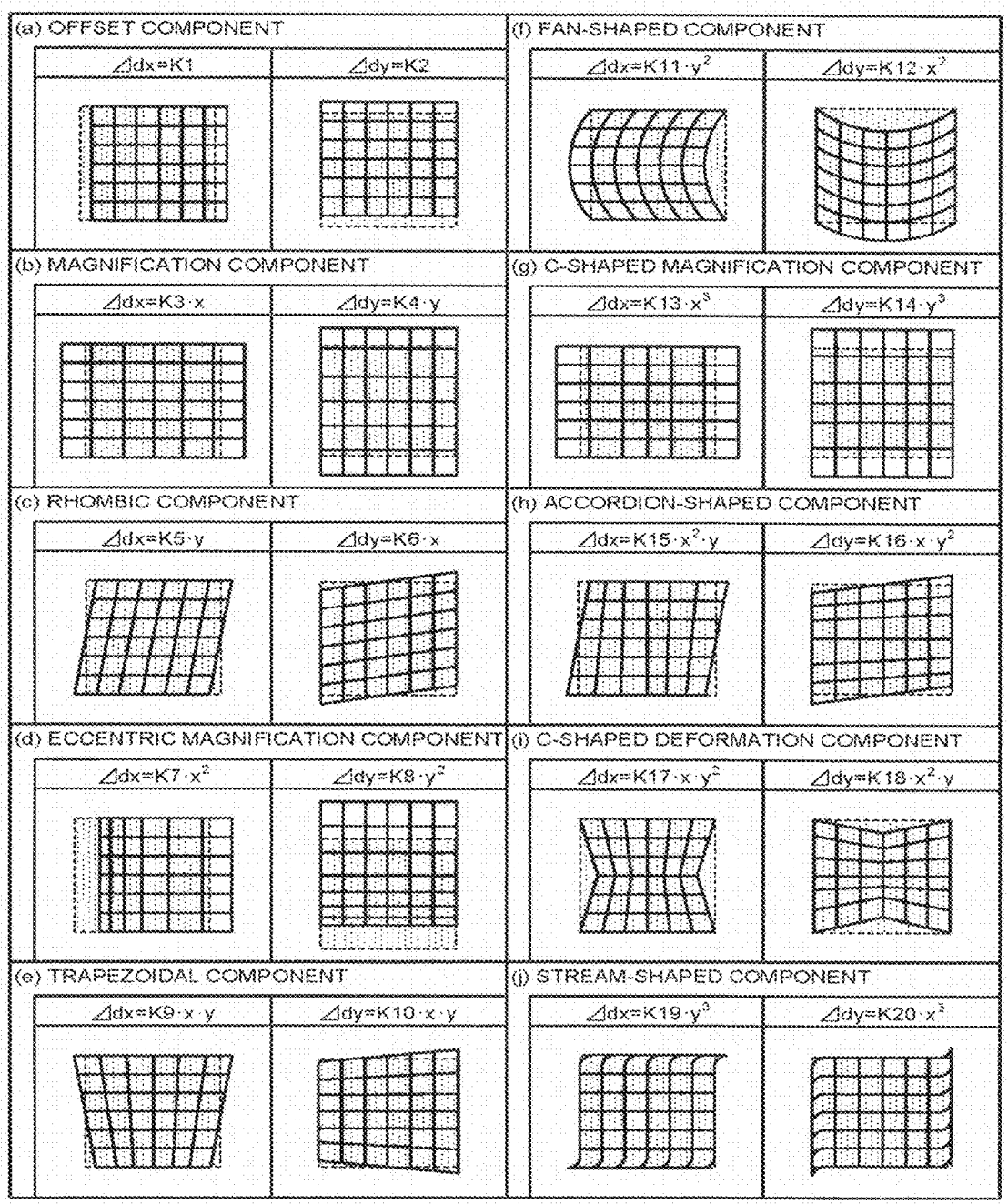
FIG. 9 is diagram illustrating examples of a positional slippage component.

The amount of positional slippage (superposition error) between the underlayer pattern and the resist pattern 40Y includes various components. The positional slippage components will be described below. FIG. 9 is diagram illustrating examples of the positional slippage components.

In FIG. 9, (a) illustrates an offset component, (b) illustrates a magnification component, (c) illustrates a rhombic component, (d) illustrates an eccentric magnification component, (e) illustrates a trapezoidal component, (f) illustrates a fan-shaped component, (g) illustrates a C-shaped magnification component, (h) illustrates an accordion-shaped component, (i) illustrates a C-shaped deformation component, and (j) illustrates a stream-shaped component.

(a) The offset component is $\Delta dx=K1$ and $\Delta dy=K2$.

(b) The magnification component is $\Delta dx=K3 \cdot x$ and $\Delta dy=K4 \cdot y$.

(c) The rhombic component is $\Delta dx=K5 \cdot y$ and $\Delta dy=K6 \cdot x$.

(d) The eccentric magnification component is $\Delta dx=K7 \cdot x^2$ and $\Delta dy=K8 \cdot y^2$.

(e) The trapezoidal component is $\Delta dx=K9 \cdot x \cdot y$ and $\Delta dy=K10 \cdot x \cdot y$.

(f) The fan-shaped component is $\Delta dx=K11 \cdot y^2$ and $\Delta dy=K12 \cdot x^2$.

(g) The C-shaped magnification component is $\Delta dx=K13 \cdot X^3$ and $\Delta dy=K14 \cdot y^3$.

(h) The accordion-shaped component is $\Delta dx=K15 \cdot x^2 \cdot y$ and $\Delta dy=K16 \cdot x \cdot y^2$.

(i) The C-shaped deformation component is $\Delta dx=K17 \cdot x \cdot y^2$ and $\Delta dy=K18 \cdot x^2 \cdot y$.

(j) The stream-shaped component is $\Delta dx=K19 \cdot y^3$ and $\Delta dy=K20 \cdot x^3$.

The positional slippage between the underlayer pattern and the resist pattern 40Y is a combination of these components. Since the positional slippage corresponds to the suctioned portion flatness, the spherical approximation unit 23 calculates the Zernike coefficient by approximating the suctioned portion flatness to the Zernike series. Zernike terms of a Zernike polynomial will be described below.

Figure 10A:
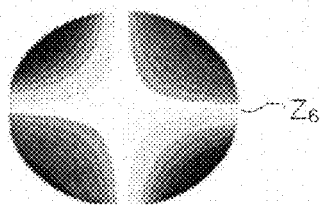
FIGS. 10A to 10C are diagrams illustrating Zernike terms.
Figure 10B:
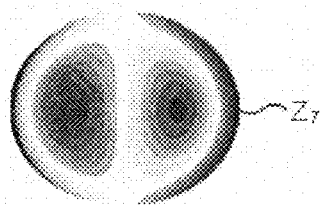
Figure 10C:
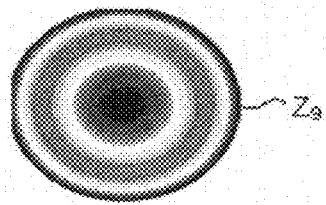

FIGS. 10A to 10C are diagrams illustrating Zernike terms. The Zernike terms affecting the suctioned portion flatness out of the Zernike terms $Z_1$ to $Z_{81}$ of the Zernike polynomial (circular polynomial) are $Z_6$ illustrated in FIG. 10A, $Z_7$ illustrated in FIG. 10B, $Z_6$ illustrated in FIG. 10C, and the like.

FIG. 11 is a diagram illustrating a calculation example of the front flatness according to the embodiment, (a) of FIG. 11 illustrates rear flatness 45-1 and 45-2 of learning templates L1 and L2. (b) of FIG. 11 illustrates suctioned portion flatness 46-1 and 46-2 of the learning templates L1 and L2. (c) of FIG. 11 illustrates front flatness 47-1 and 47-2 of the learning templates L1 and L2.

The suctioned portion flatness 46-1 and 46-2 illustrated in (b) of FIG. 11 are calculated using the rear flatness 45-1 and 45-2 illustrated in (a) of FIG. 11. The suctioned portion flatness 46-1 of the learning template L1 has the $Z_9$ component of the Zernike polynomial. The suctioned portion flatness 46-2 of the learning template L2 has the $Z_6$ component of the Zernike polynomial. The front flatness 47-1 and 47-2 illustrated in (c) of FIG. 11 are calculated using the suctioned portion flatness 46-1 and 46-2 illustrated in (b) of FIG. 11.

Figure 12:
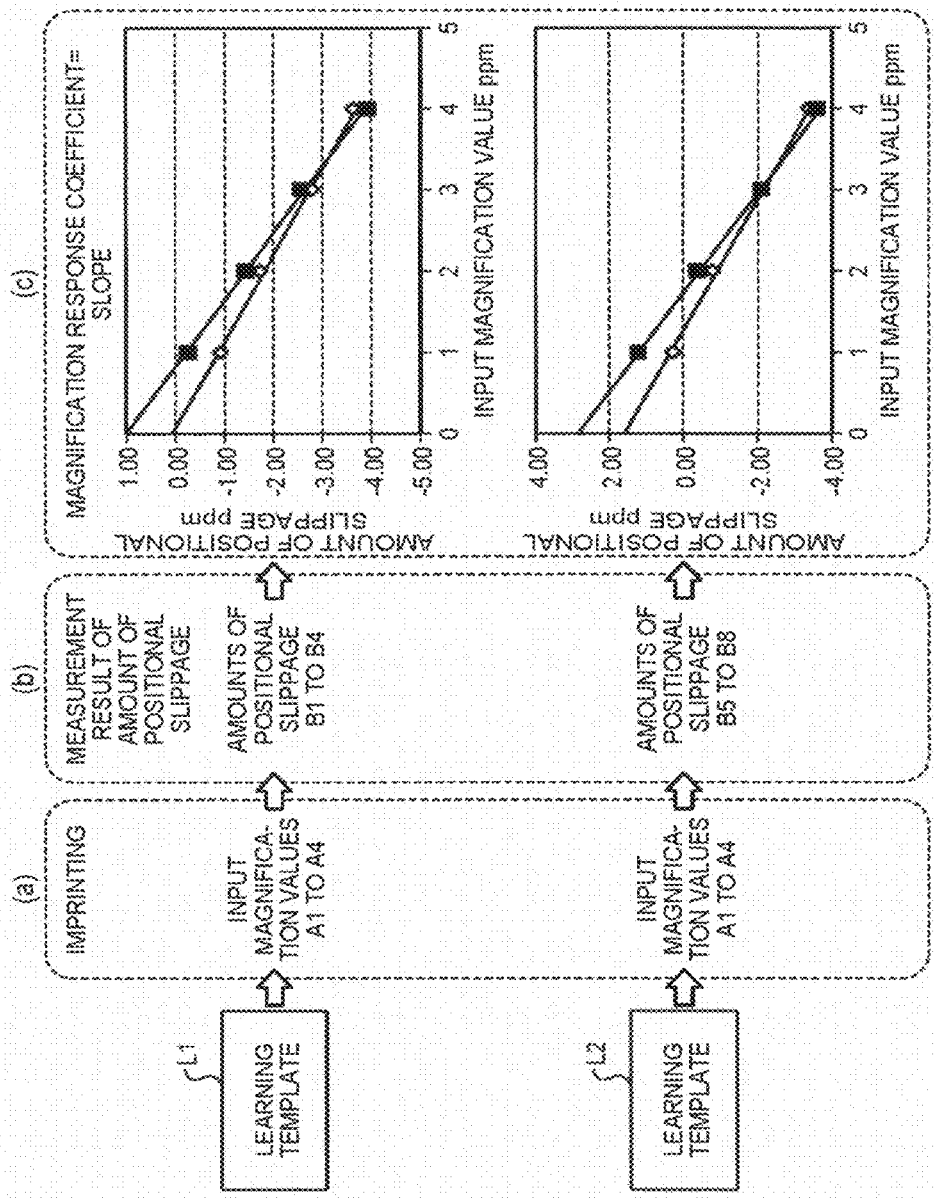
FIG. 12 is a diagram illustrating calculation examples of the magnification response coefficient according to the embodiment.

FIG. 12 is a diagram illustrating a calculation example of the magnification response coefficient according to the embodiment. The imprinting apparatus 101 performs the imprinting process on the wafer Wy with various input magnification values using the learning templates L1 and L2.

(a) of FIG. 12 illustrates the input magnification value in the imprinting process. The input magnification values to the learning templates L1 and L2 are A1 to A4. A1 to A4 are, for example, as follows.

$$A1 = X/Y = -1.0/-1.0 \text{ ppm}$$

$$A2 = X/Y = -2.0/-2.0 \text{ ppm}$$

$$A3 = X/Y = -3.0/-3.0 \text{ ppm}$$

$$A4 = X/Y = -4.0/-4.0 \text{ ppm}$$

(b) of FIG. 12 illustrates a measurement result (OL (Overlay) measured value) (adjustment result) of the amounts of positional slippage of the resist pattern formed through the imprinting process. The amounts of positional slippage illustrated in (b) of FIG. 12 are amounts of positional slippage (magnifications) of the resist pattern formed using the input magnification values illustrated in (a) of FIG. 12.

The amounts of positional slippage of the learning template L1 are B1 to B4 and the amounts of positional slippage of the learning template L2 are B5 to B8. B1 to B4 correspond to A1 to A4 of the learning templates L1, respectively, and B5 to B8 correspond to A1 to A4 of the learning templates L2, respectively.

B1 to B4 are, for example, as follows.

$B1=X/Y=-0.9/-0.2$ ppm $B2=X/Y=-1.7/-1.4$ ppm $B3=X/Y=-2.7/-2.5$ ppm $B4=X/Y=-3.5/-4.0$ ppm B5 to B8 are, for example, as follows.

$B5=X/Y=0.1/1.2$ ppm $B6=X/Y=-0.3/-0.6$ ppm $B7=X/Y=-2.0/-2.0$ ppm $B8=X/Y=-3.7/-3.7$ ppm (c) of FIG. 12 illustrates the magnification response coefficient. The magnification response coefficient illustrated in (c) of FIG. 12 are calculated using the input magnification values illustrated in (a) of FIG. 12 and the amounts of positional slippage illustrated in (b) of FIG. 12.

The horizontal axis of the graph illustrated in (c) of FIG. 12 represents the input magnification value (ppm) illustrated in (a) of FIG. 12. The vertical axis of the graph illustrated in (c) of FIG. 12 represents the amount of positional slippage (ppm) illustrated in (b) of FIG. 12.

The relationship in the X direction of the learning template L1 is $y=-0.9251x+0.0566$ and $R^2=0.9969$. The relationship in the Y direction of the learning template L1 is $y=-1.2122x+0.9969$ and $R^2=0.9977$. Therefore, the magnification response coefficient (slope) in the X direction of the learning template L1 is $X=-0.93$ and the magnification response coefficient (slope) in the Y direction thereof is $X=-1.21$.

The relationship in the X direction of the learning template L2 is $y=-1.2486x+1.5813$ and $R^2=0.996$. The relationship in the Y direction of the learning template L2 is $y=-1.6032x+2.7953$ and $R^2-0.9994$. Therefore, the magnification response coefficient (slope) in the X direction of the learning template L2 is $X=-1.25$ and the magnification response coefficient (slope) in the Y direction thereof is $X=-1.60$.

Figure 13:
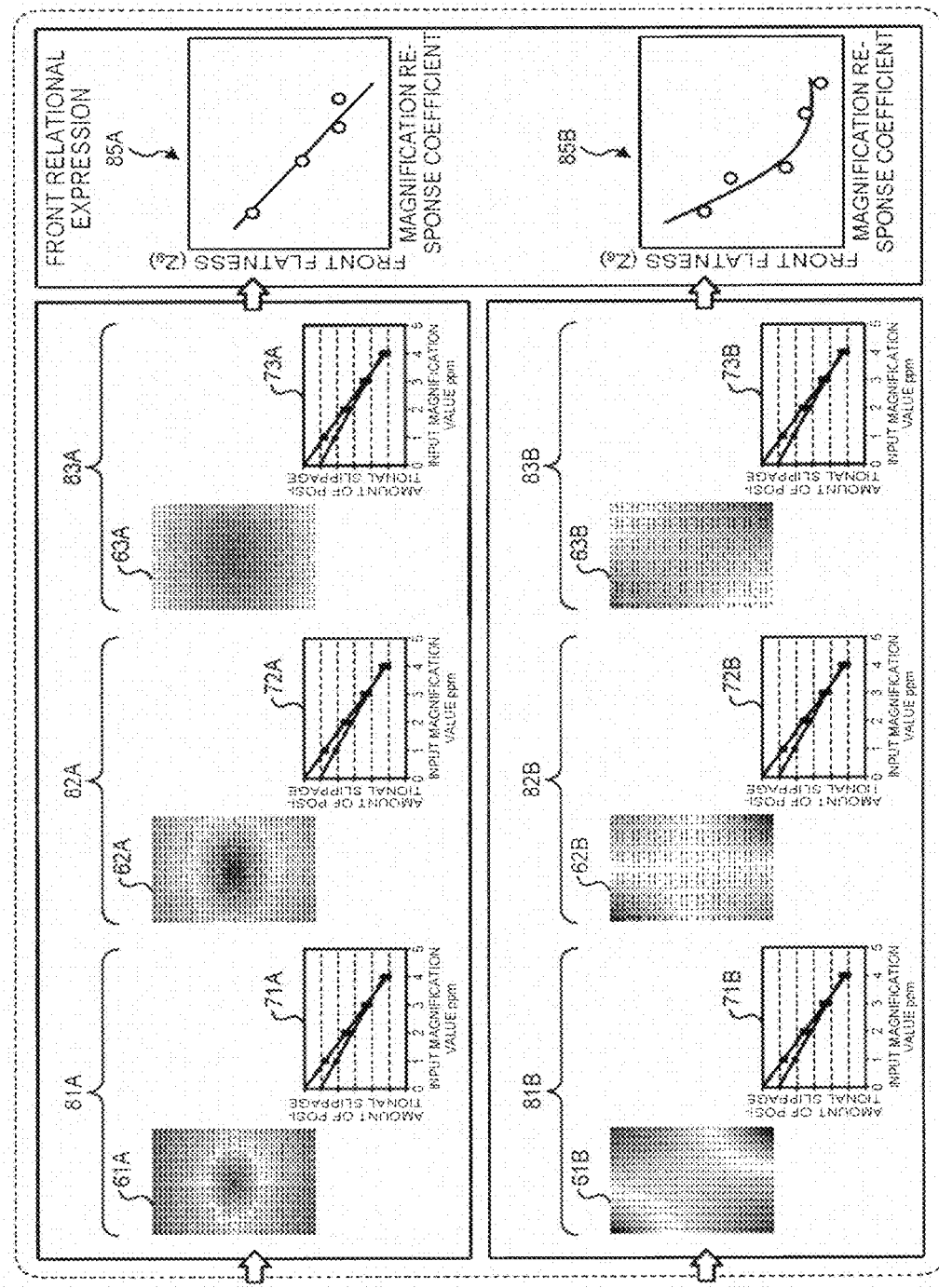
FIG. 13 is a diagram illustrating a creation example of a front relational expression according to the embodiment.

FIG. 13 is a diagram illustrating a creation example of the front relational expression according to the embodiment. The front relational expression is a relational expression between the front flatness and the magnification response coefficient. The front relational expression of the learning template having the $Z_9$ component of the Zernike polynomial and the front relational expression of the learning template having the $Z_6$ component of the Zernike polynomial will be described with reference to FIG. 13.

The relational expression creating unit 25 calculates the front flatness and the magnification response coefficient for each learning template of plural learning templates having the $Z_9$ component of the Zernike polynomial. The relational expression creating unit 25 calculates, for example, a correlation 81A between front flatness 61A and a magnification response coefficient 71A for a first learning template. The relational expression creating unit 25 calculates, for example, a correlation 82A between front flatness 62A and a magnification response coefficient 72A for a second learning template. The relational expression creating unit 25 calculates, for example, a correlation 83A between front flatness 63A and a magnification response coefficient 73A for a third learning template.

The front flatness 61A is the front flatness of $Z_9=3.0$ μm and the magnification response coefficient (slope) 71A is $X=-0.93$ and $Y=-1.21$. The front flatness 62A is the front flatness of $Z_9=2.0$ μm and the magnification response coefficient (slope) 72A is $X=-0.96$ and $Y=-1.13$. The front flatness 63A is the front flatness of 1.0 μm and the magnification response coefficient (slope) 73A is $X=-0.98$ and $Y=-1.06$.

The relational expression creating unit 25 calculates the front relational expression 85A based on the correlations 81A to 83A. In the graph of the front relational expression 85A, the horizontal axis represents the magnification correction value and the vertical axis represents the front flatness. The front relational expression 85A corresponds to the $Z_9$ component of the Zernike polynomial. The front relational expression 85A is, for example, a front relational expression in the X direction or the Y direction. The relational expression creating unit 25 creates the front relational expression in the X direction and the front relational expression in the Y direction based on the correlations 81A to 83A.

The relational expression creating unit 25 calculates the front flatness and the magnification response coefficient for each learning template of plural learning templates having the $Z_6$ component of the Zernike polynomial. The relational expression creating unit 25 calculates, for example, a correlation 81B between front flatness 61B and a magnification response coefficient 71B for a fourth learning template. The relational expression creating unit 25 calculates, for example, a correlation 82B between front flatness 62B and a magnification response coefficient 72B for a fifth learning template. The relational expression creating unit 25 calculates, for example, a correlation 83B between front flatness 63B and a magnification response coefficient 73B for a sixth learning template.

The front flatness 61B is the front flatness of $Z_9=3.0$ μm and the magnification response coefficient (slope) 71B is $X=-1.25$ and $Y=-1.60$. The front flatness 62B is the front flatness of $Z_6=2.0$ μm and the magnification response coefficient (slope) 72B is $X=-1.16$ and $Y=-1.43$. The front flatness 63B is the front flatness of $Z_9=1.0$ μm and the magnification response coefficient (slope) 73B is $X=-1.08$ and $Y=-1.26$.

The relational expression creating unit 25 calculates the front relational expression 85B based on the correlations 81B to 83B. In the graph of the front relational expression 85B, the horizontal axis represents the magnification correction value and the vertical axis represents the front flatness. The front relational expression 85B corresponds to the $Z_6$ component of the Zernike polynomial. The front relational expression 85B is, for example, a front relational expression in the X direction or the Y direction. The relational expression creating unit 25 creates the front relational expression in the X direction and the front relational expression in the Y direction based on the correlations 81B to 83B.

Figure 14:
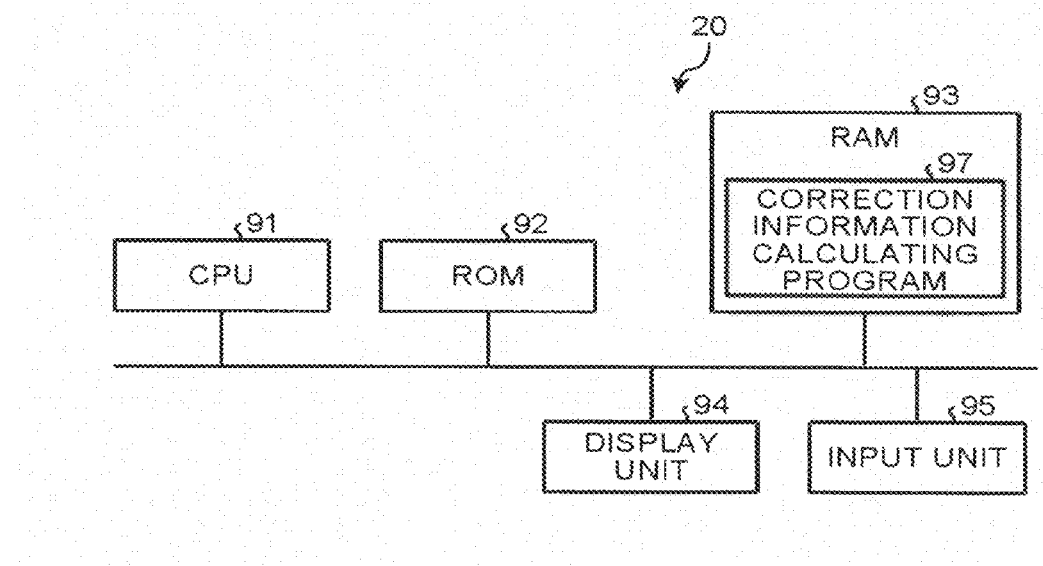
FIG. 14 is a diagram illustrating a hardware configuration of a correction information calculating device according to the embodiment.

The hardware configuration of the correction information calculating device 20 will be described below. FIG. 14 is a diagram illustrating the hardware configuration of the correction information calculating device. The correction information calculating device 20 includes a central processing unit (CPU) 91, read only memory (ROM) 92, random access memory (RAM) 93, a display unit 94, and an input unit 95. In the correction information calculating device 20, the CPU 91, the ROM 92, the RAM 93, the display unit 94, and the input unit 95 are connected to each other via a bus line.

The CPU 91 calculates the magnification response coefficient using a correction information calculating program 97 which is a computer program. The correction information calculating program 97 is a computer program product including a non-transitory computer-readable recording medium including plural commands, which can be executed by a computer, for calculating the magnification response coefficient. In the correction information calculating program 97, the plural commands cause the computer to calculate the magnification correction value.

The display unit 94 is a display device such as a liquid crystal monitor and displays the rear flatness, the suctioned portion flatness, the front flatness, the positional slippage, the correlation information, the front relational expression, and the magnification response coefficient as the correction information based on an instruction from the CPU 91.

The input unit 95 includes a mouse or a keyboard and receives instruction information (parameters and the like required for calculating the magnification response coefficient) input from the outside by a user. The instruction information input to the input unit 95 is transmitted to the CPU 91.

The correction information calculating program 97 is stored in the ROM 92 and is loaded into the RAM 93 via the bus line. FIG. 14 illustrates a state in which the correction information calculating program 97 is loaded into the RAM 93.

The CPU 91 executes the correction information calculating program 97 loaded into the RAM 93. Specifically, in the correction information calculating device 20, in response to an input of an instruction from the input unit 95 by the user, the CPU 91 reads the correction information calculating program 97 from the ROM 92, develops the read correction information calculating program 97 in a program storage area in the RAM 93, and performs various processes. The CPU 91 temporarily stores a variety of data generated in various processes in a data storage area formed in the RAM 93.

The correction information calculating program 97 which is executed in the correction information calculating device 20 is configured as a module including the suctioned portion flatness extracting unit 22, the spherical approximation unit 23, the front flatness calculating unit 24, the relational expression creating unit 25, and the correction information calculating unit 26, which are loaded into a main storage device and are generated in the main storage device.

In manufacturing semiconductor devices (semiconductor integrated circuits), the magnification response coefficient or the magnification correction value are calculated, for example, for each layer of a wafer process. After the template Tx is corrected in magnification, the imprinting process is performed.

Specifically, an underlayer film is formed on a wafer Wx and a resist is applied to the underlayer film. Then, the imprinting process is performed in a state in which the template Tx is corrected in magnification. Thereafter, the underlayer film is etched using the resist pattern as a mask. Accordingly, an actual pattern corresponding to the resist pattern is formed on the wafer Wx. In manufacturing semiconductor devices, the magnification response coefficient calculating process, the template Tx magnification correcting process, the underlayer film forming process, the resist applying process, the template Tx magnification correcting process, the imprinting process, the etching process, and the like are repeated for each layer.

This embodiment describes above that the transfer substrate is the wafer Wx, but the transfer substrate may be a template.

In this way, in this embodiment, the flatness of the learning template L is measured in the state in which the master stage 2X suctions the learning template L (first template). The flatness relational expression indicating the relationship between the response coefficient indicating the actual amount of positional slippage of the learning template L from the input magnification value (first input adjustment value) and the flatness of the learning template L is created.

The flatness of the template Tx in the state in which the master stage 2X suctions the template Tx is measured. The correction information calculating device 20 calculates the response coefficient (correction information) corresponding to the template Tx out of the response coefficients based on the flatness of the template Tx and the flatness relational expression. The control device 30 corrects the input magnification adjustment value to the template Tx using the response coefficient corresponding to the template Tx. The control device 30 causes the pressing unit 31 to adjust the shape and the size of the template Tx using the corrected input magnification adjustment value. Accordingly, it is possible to easily suppress the positional slippage of the pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprinting apparatus comprising:
a pressing unit, the pressing unit being a unit that adjusts, by pressing each of four side surfaces of a first template, a shape and a size of the first template by an amount corresponding to a first input adjustment value when a first imprinting process using the first template is being performed, the pressing unit being a unit that adjusts, by pressing each of four side surfaces of a second template, a shape and a size of the second template by an amount corresponding to a second input adjustment value when a second imprinting process using the second template is being performed;
a suction unit, the suction unit being a unit that suctions and fixes a rear surface of the first template when the first imprinting process is being performed, the suction unit being a unit that suctions and fixes a rear surface of the second template when the second imprinting process is being performed;
a contact processing unit that brings a template pattern formed on a front surface of the second template into contact with a resist placed on a substrate and fills the template pattern with the resist;
a correction information calculating device that calculates, as correction information, a response coefficient that corresponds to the second template out of response coefficients that indicate an actual amount of positional slippage of the first template from the first input adjustment value, the response coefficient that corresponds to the second template being calculated based on a flatness relational expression and second front flatness, the flatness relational expression indicating a relation between first front flatness and the response coefficients, the first front flatness being flatness of a front surface of the first template in a state in which the first template is suctioned by the suction unit, the second front flatness being flatness of a front surface of the second template in a state in which the second template is suctioned by the suction unit, the correction information calculating device including:

a front flatness calculating unit, the front flatness calculating unit being a unit that calculates the first front flatness based on first rear flatness, the front flatness calculating unit being a unit that calculates the second front flatness based on second rear flatness, the first rear flatness being flatness of the rear surface of the first template in a state in which the first template is suctioned by the suction unit, the second rear flatness being flatness of the rear surface of the second template in a state in which the second template is suctioned by the suction unit, a suctioned portion flatness extracting unit, the suctioned portion flatness extracting unit being a unit that extracts, from the first rear flatness, first suctioned portion flatness, the first suctioned portion flatness being flatness of an area of the first template covered by the suction unit, the suctioned portion flatness extracting unit being a unit that extracts, from the second rear flatness, second suctioned portion flatness, the second suctioned portion flatness being flatness of an area of the second template covered by the suction unit, and an approximation unit, the approximation unit being a unit that calculates a first Zernike coefficient by functionally approximating the first suctioned portion flatness in the polar coordinate system and calculates the first front flatness based on the first Zernike coefficient, the approximation unit being a unit that calculates a second Zernike coefficient by functionally approximating the second suctioned portion flatness in the polar coordinate system and calculates the second front flatness based on the second Zernike coefficient; and a control unit that corrects the second input adjustment value using the correction information and causes the pressing unit to adjust the shape and the size of the second template using the corrected second input adjustment value; and a flatness measuring device, the flatness measuring device being a device that measures the first rear flatness of the first template in a state in which the first template is suctioned by the suction unit, the flatness measuring device being a device that measures the second rear flatness of the second template in a state in which the second template is suctioned by the suction unit.

2. The imprinting apparatus according to claim 1, wherein the first and second templates are formed of a plate-shaped member.

3. The imprinting apparatus according to claim 1, wherein the second input adjustment value is a value based on a superposition error between the substrate and the second template.

4. The imprinting apparatus according to claim 1, wherein the correction information calculating device further includes a relational expression creating unit that creates the flatness relational expression based on an amount of positional slippage of a resist pattern that is formed when the first imprinting process is performed, the first input adjustment value, and the first front flatness.

* * * * *